United States Patent
Lam

(10) Patent No.: US 7,932,590 B2
(45) Date of Patent: *Apr. 26, 2011

(54) STACKED-DIE ELECTRONICS PACKAGE WITH PLANAR AND THREE-DIMENSIONAL INDUCTOR ELEMENTS

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 103 days.

This patent is subject to a terminal disclaimer.

(21) Appl. No.: 11/457,409

(22) Filed: Jul. 13, 2006

(65) Prior Publication Data

US 2008/0054428 A1   Mar. 6, 2008

(51) Int. Cl.
*H01L 23/02* (2006.01)

(52) U.S. Cl. ........ 257/686; 257/531; 257/787; 257/796; 257/733; 257/678; 257/E23.001; 257/E23.194; 257/E21.499; 257/E21.519; 257/684; 257/687; 257/690

(58) Field of Classification Search .................. 257/686, 257/678, 687, 700, 777, 707, 684, 690, E23.001, 257/E23.194

See application file for complete search history.

(56) References Cited

U.S. PATENT DOCUMENTS

| | | | |
|---|---|---|---|
| 5,478,773 A | 12/1995 | Dow et al. | |
| 5,541,135 A | 7/1996 | Pfeifer et al. | |
| 6,008,102 A | 12/1999 | Alford et al. | |
| 6,091,144 A | 7/2000 | Harada | |
| 6,407,456 B1 | 6/2002 | Ball | |
| 6,444,517 B1 | 9/2002 | Hsu et al. | |
| 6,486,530 B1 * | 11/2002 | Sasagawa et al. | 257/532 |
| 6,538,313 B1 | 3/2003 | Smith | |
| 6,744,114 B2 | 6/2004 | Dentry et al. | |
| 6,780,677 B2 | 8/2004 | Imasu et al. | |
| 6,798,057 B2 | 9/2004 | Bolkin et al. | |
| 6,884,658 B2 | 4/2005 | Akram | |
| 6,890,829 B2 | 5/2005 | Cheng et al. | |
| 7,239,025 B2 | 7/2007 | Farrar | |
| 7,335,994 B2 | 2/2008 | Klein et al. | |

(Continued)

FOREIGN PATENT DOCUMENTS

GB    2288074    10/1995

(Continued)

OTHER PUBLICATIONS

"U.S. Appl. No. 11/304,084, Final Office Action mailed Feb. 21, 2008", 11 pgs.

(Continued)

*Primary Examiner* — Wael M Fahmy
*Assistant Examiner* — Marc Armand
(74) *Attorney, Agent, or Firm* — Fish & Richardson P.C.

(57) ABSTRACT

An apparatus and a method for producing three-dimensional integrated circuit packages. In one embodiment, an electronics package with at least two dice are stacked one atop another is disclosed. A top die is of smaller size compared with a bottom die such that after a die attach operation, wire-bond pads of the bottom die will be exposed for a subsequent wire bonding operation. The bottom die contains contact pads on the front side that couple with one or more passive components fabricated on the back side of the top die to complete the circuit. In another exemplary embodiment, a method to form one or more three-dimensional passive components in a stacked-die package is disclosed wherein partial inductor elements are fabricated on the front side of the bottom die and the back side of the top die. The top and bottom elements are coupled together completing the passive component.

13 Claims, 4 Drawing Sheets

U.S. PATENT DOCUMENTS

| | | |
|---|---|---|
| 7,497,005 B2 | 3/2009 | Forbes et al. |
| 2003/0020171 A1 | 1/2003 | Dutta et al. |
| 2003/0045044 A1 | 3/2003 | Dentry et al. |
| 2003/0077871 A1 | 4/2003 | Cheng et al. |
| 2004/0036569 A1* | 2/2004 | Tsai et al. .................... 336/200 |
| 2004/0041270 A1 | 3/2004 | Shimizu et al. |
| 2004/0178473 A1 | 9/2004 | Dentry et al. |
| 2005/0002167 A1 | 1/2005 | Hsuan et al. |
| 2005/0046041 A1 | 3/2005 | Tsai |
| 2005/0133916 A1 | 6/2005 | Karnezos |
| 2005/0253257 A1* | 11/2005 | Chiu et al. .................... 257/724 |
| 2006/0011702 A1 | 1/2006 | Funaya et al. |
| 2006/0027841 A1 | 2/2006 | Tamaki |
| 2006/0245308 A1* | 11/2006 | Macropoulos et al. ........... 369/1 |
| 2006/0286716 A1 | 12/2006 | Takayama |
| 2007/0138572 A1 | 6/2007 | Lam |
| 2007/0138628 A1 | 6/2007 | Lam |

FOREIGN PATENT DOCUMENTS

| | | |
|---|---|---|
| WO | WO-0054337 A1 | 9/2000 |
| WO | WO-2008008581 A2 | 1/2008 |
| WO | WO-2008008581 A3 | 1/2008 |
| WO | WO-2008008587 A2 | 1/2008 |
| WO | WO-2008008587 A3 | 1/2008 |

OTHER PUBLICATIONS

"U.S. Appl. No. 11/456,685, Non-Final Office Action mailed May 14, 2008", 19 pgs.

"U.S. Appl. No. 11/456,685, Response filed Sep. 15, 2008 to Non-Final Office Action mailed May 15, 2008", 17 pgs.

"U.S. Appl. No. 11/456,685, Restriction Requirement mailed Mar. 28, 2008", 6 pgs.

"U.S. Appl. No. 11/456,685, Response filed Apr. 28, 2008 to Restriction Requirement mailed Mar. 28, 2008", 5 pgs.

"International Application Serial No. PCT/US2007/071079, International Search Report mailed May 16, 2008", 4 pgs.

"International Application Serial No. PCT/US2007/071079, Written Opinion mailed May 16, 2008", 5 pgs.

"PCT Application No. PCT/US07/70612, International Search Report mailed Apr. 21, 2008", 2 pgs.

"PCT Application No. PCT/US07/70612, Written Opinion Apr. 21, 2008", 10 pgs.

"U.S. Appl. No. 11/456,685, Restriction Requirement mailed Jun. 25, 2009", 5 pgs.

"U.S. Appl. No. 11/456,685, Notice of Non-Compliant Amendment mailed Nov. 17, 2009", 2 pgs.

"U.S. Appl. No. 11/456,685, Response filed Jan. 19, 2010 to Notice of Non-Compliant Amendment mailed Nov. 17, 2009", 8 pgs.

"U.S. Appl. No. 11/456,685, Response filed Aug. 25, 2009 to Election Requirement mailed Jun, 25, 2009", 8 pgs.

U.S. Appl. No. 11/456,685, Non-Final Office Action mailed Nov. 22, 2010, 9 pages.

* cited by examiner

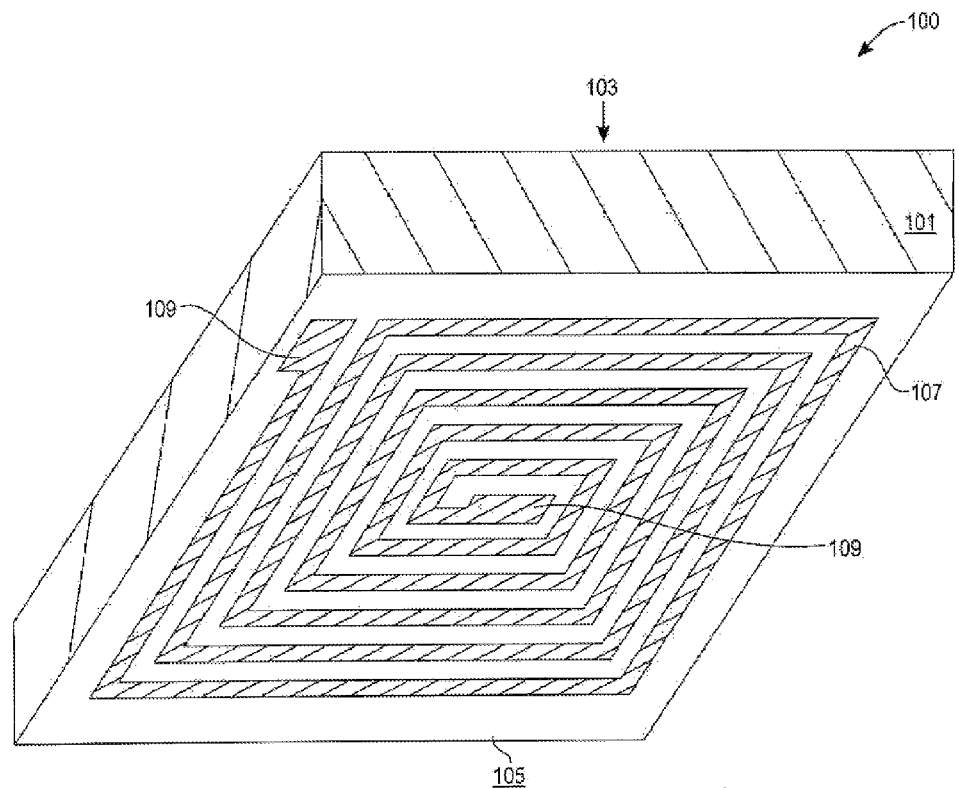
Fig._1
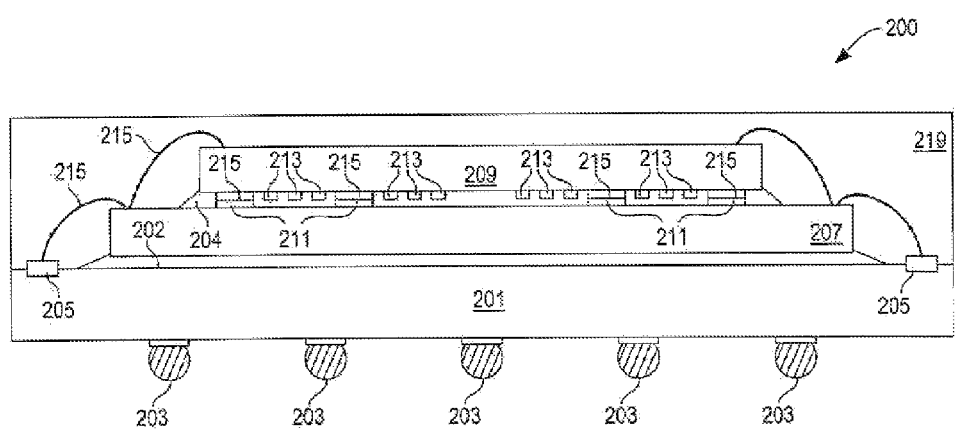
Fig._2

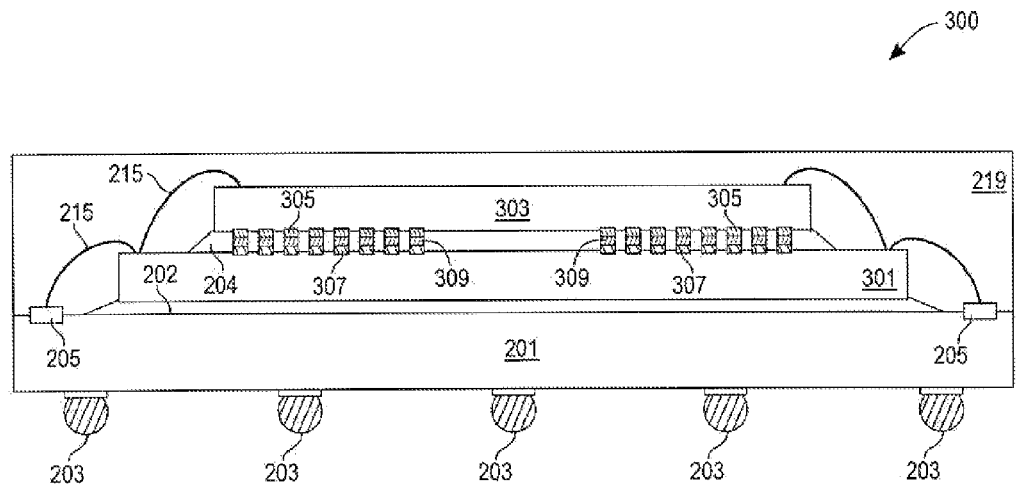
Fig._3A
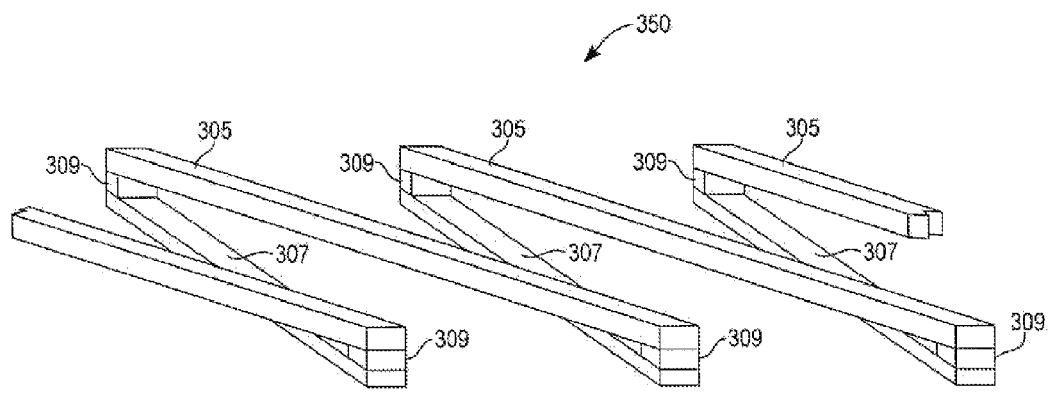
Fig._3B

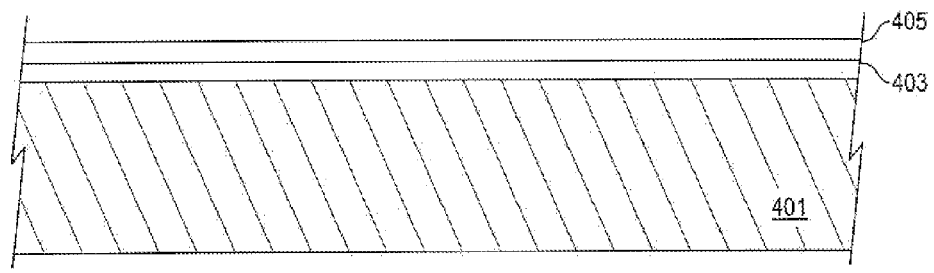
Fig._4A
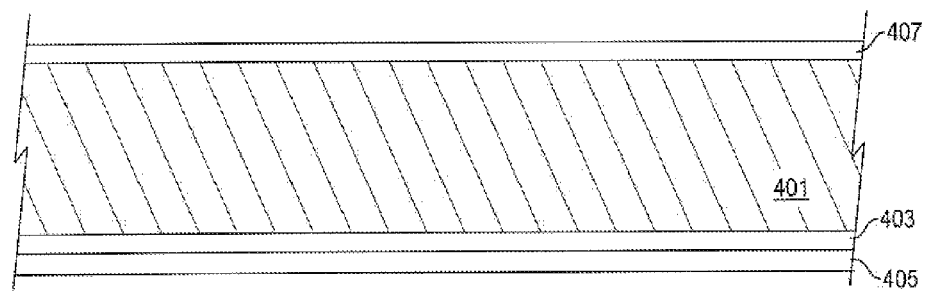
Fig._4B
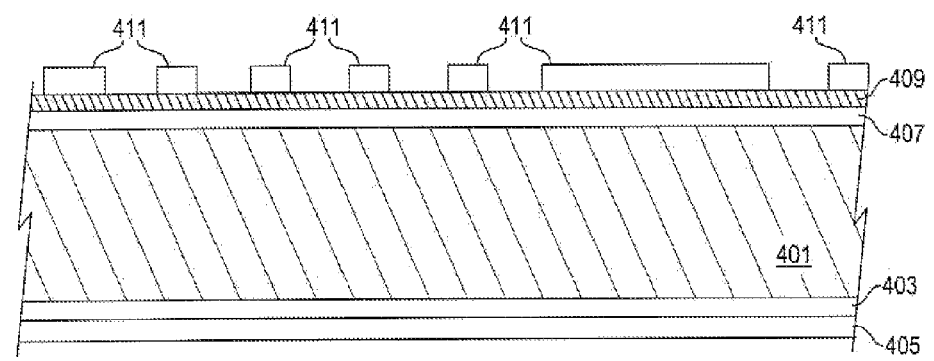
Fig._4C

STACKED-DIE ELECTRONICS PACKAGE WITH PLANAR AND THREE-DIMENSIONAL INDUCTOR ELEMENTS

CROSS-REFERENCE TO RELATED APPLICATIONS

The following U.S. patent application is relied upon and is incorporated by reference in its entirety in this application: U.S. patent application Ser. No. 11/456,685, filed Jul. 11, 2006.

TECHNICAL FIELD

The invention relates to an integrated circuit package, and more particularly, to incorporating passive components, on a back side of a substrate having a fabricated integrated circuit device.

BACKGROUND ART

As electronic packages increase in both required functionality and the number of functions an electronic package is expected to perform, passive components are frequently needed to accomplish specific circuit tuning. Circuit tuning either adds tunable characteristics to the package or enables the package to perform properly. Enabling, proper performance is especially required in many radio-frequency (RF) applications. For example, high-Q inductors are frequently needed in RF applications.

Adding discrete passive components to electronic packages typically results in an increase in both the size and weight of the package. These increases counter contemporary goals of increased portability and miniaturization. Adding discrete passive, components in electronic packages also requires a dedicated production line, frequently including surface mounting equipment and added process setups. The added equipment and processes increase both capital investment and assembly lead-time, resulting in higher product costs.

Currently, these problems are being addressed by fabricating passive components, (e.g., inductors, capacitors, and resistors) over the, active circuitry of an integrated circuit device. Integrating passive components requires various fabrication methods such as thin-film, photolithographic, and plating processes. Vias are formed over a top passivation layer of an integrated circuit device thus allowing integrated passive components to connect to the underlying integrated circuitry elements.

Consequently, current, solutions for adding passive components to an integrated circuit device require custom-designed contact via openings to be at the top passivation layer for each product device. If a product is not initially designed to accept passive components, they cannot be simply added to the device. Therefore, what is need is a simple, inexpensive, and reliable means to add passive components to any integrated circuit without requiring, for example, custom designed contact vias or precise photolithography.

SUMMARY

In an exemplary embodiment, the present invention is an integrated circuit device with a first substrate and a second, substrate. The first, substrate has a front side having one or more integrated circuit devices and a plurality of bond pads fabricated on its surface. The second substrate has a smaller area than the first substrate. The front, side of the second substrate has one or more integrated circuit devices fabricated on its surface. At least one passive component is fabricated onto a back side of the second substrate. An electrical conductor allows electrical communications between the at least one passive component of the second substrate and at least one of the one or more integrated circuit devices of the first substrate.

In another exemplary embodiment, the present invention is an integrated, circuit device with a first substrate and a second substrate. The first substrate has a front side with one or more integrated circuit devices and a plurality of bond pads fabricated on its surface. The second substrate has a smaller area than the first substrate. A front side of the second substrate has one or more integrated circuit devices fabricated on its surface. A first portion of at least one passive component is fabricated onto a back side of the second substrate. A second portion of at least one passive component is fabricated onto the front side of the first substrate, the second portion of the at least one passive component is formed so as to mirror the first portion. An electrical conductor allows electrical communications between the two portions of the at least one passive component.

In another exemplary embodiment, the present invention is a method of forming one or more passive components on a plurality of substrates. The method includes selecting a first substrate and a second substrate such that an area of the second substrate is less than an area of the first substrate, forming at least one integrated circuit on a front side of each of the first and second substrates, forming a plurality of bond pads on the front side of the first substrate, and forming a photoresist layer over a back side of the second substrate. The photoresist layer is then patterned and etched to form one or more passive component structures on the back side of the second substrate. The etched areas are filled with a metal and the one or more passive component structures are electrically bonded to selected ones of the plurality of bond pads.

In another exemplary embodiment, the present invention is a method of forming one or more passive components on a plurality of substrates where the method includes selecting a first substrate and a second substrate such that an area of the second substrate is less than an area of the first substrate, forming at least one integrated circuit on a front side of each of the first and second substrates, and forming a plurality of bond pads on the front side of the first substrate. A first portion of at least one passive component structure is formed on a back side of the second substrate. A second portion of at least one passive component structure is formed over the at least one integrated circuit on the front side of the first substrate where the second portion being a mirror image of the first portion. The first and second portions of the at least one passive component structure are then electrically bonded.

BRIEF DESCRIPTION OF THE DRAWINGS

FIG. 1 is an isometric drawing of a passive element fabricated on a back side of an integrated circuit substrate in accordance with an exemplary embodiment of the present invention.

FIG. 2 illustrates integrated circuit dice fabricated in accordance with an exemplary method of the present invention and mounted in a ball grid array (BGA) package.

FIG. 3A illustrates integrated circuit dice fabricated in accordance with another exemplary method of the present invention and mounted in a ball grid array (BGA) package.

FIG. 3B is a detail drawing of an inductor formed in portions on different integrated circuit dice.

FIGS. 4A-4F are exemplary fabrication steps of an integrated circuit device produced in accordance with the present invention.

DETAILED DESCRIPTION

Figure 4D:
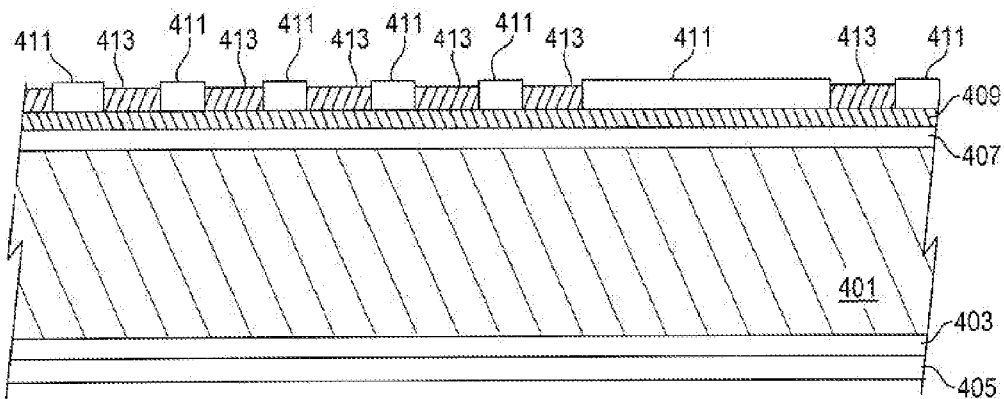

In FIG. 1, an integrated circuit die 100 includes a substrate 101 having a front side 103 and a back side 105. In a specific exemplary embodiment, the substrate 101 is portion of a silicon wafer. However, a skilled artisan will recognize that other semiconducting and non-semiconducting materials may be used instead of silicon for the substrate 101. Other semiconducting materials include, for example, elemental semiconductors such, as germanium, compound semiconductors such as group III-V, and II-VI materials, and semiconducting alloys (e.g., $Al_xGa_{1-x}As$, $HG_{1-x}CD_xTe$). Additionally, non-semiconducting materials such as, for example, a polyethylene-terephthalate (PET) substrate deposited with silicon dioxide or a quartz photomask, each of which may be deposited with polysilicon followed by an excimer laser annealing (ELA) anneal step.

On the back side 105 of the substrate 101, one or more passive components are formed. In this exemplary embodiment, a large single, inductor 107 is formed. The inductor 107 terminates with a bond pad 109 on either end. Techniques disclosed herein apply readily to various types of passive components (e.g., inductors, resistors, capacitors, etc.). The passive components may be fabricated individually or in various combinations and with varying sizes. FIG. 1 therefore should be viewed as merely illustrative only of a generalized concept to be described in greater detail below.

With reference to FIG. 2, a stacked-die bail grid array (BGA) package 200 includes a BGA substrate 201 and a plurality of BGA balls 203. The BGA package type is generally known in the art. Mounted to the BGA substrate 201 is a first integrated circuit die 207 fabricated in accordance with methods known in the art. There is a plurality of contact vias 211 fabricated on the front side of the first integrated circuit die 207.

A second integrated circuit die 209 fabricated in accordance, with an exemplary embodiment, of the present invention is mounted on top of the first integrated circuit die 207. The first integrated circuit die is mounted to the BGA substrate with a first adhesive 202. The second integrated circuit die 209 is mounted to the front side, of the first, integrated circuit die with a second adhesive 204. The first and second adhesives 202, 204 may be, for example, various types of electrically- or non-electrically-conductive tape or epoxy.

One or more passive components 213 are fabricated on the back side of the second integrated circuit die 209. Each of the one or more passive components 213 has an associated plurality of passive component bond pads 215. The plurality of passive component bond pads 215 is also fabricated, on the back side of the second integrated circuit die 209. In a specific exemplary embodiment, the one or more passive, components 213 is an inductor. Each inductor will therefore have at least two associated bond pads. If an electrically conductive tape or epoxy is used for the second adhesive 204, it must be insulated from the one or more passive components 213 and the associated plurality of passive component bond pads 215 so as to not electrically short either the components or pads.

Electrical connections are made from the one or more passive components 213 through the plurality of passive component bond pads 215 to the plurality of contact vias 211. Electrical communication occurs between the one or more passive components 213 on the second integrated circuit die 209 and the plurality of contact vias 211 on the first integrated circuit die 211 through, for example, conductive epoxy, solder, conductive polymers, metal-to-metal bonding, etc.

Integrated circuit devices (not shown) are fabricated on the front side of each the first and second integrated circuit dice 207, 209. A plurality of bond wires 215 connect the front side integrated circuit devices to the BGA substrate 201. The BGA substrate 201 and the integrated circuit dice 207, 209 are protected with an encapsulant 219.

In FIG. 3A, a stacked-die ball grid array (BGA) package 300 includes a first integrated circuit die 301 and a second integrated circuit die 303. The first and second integrated circuit dice 301, 303 each are fabricated with a portion of an inductor 305, 307. An inductor first portion 307 is fabricated on the front side of the first integrated circuit die 301. An inductor second portion 305 is fabricated on the back side of the second integrated circuit die 303. Details of exemplary techniques for fabricating the inductor portions 305, 307 are disclosed below.

Mounting the first and second integrated circuit dice 301, 303 brings the two inductor portions 305, 307 in proximity to each other. An interconnecting, material 309 forms an electrical connection between the two portions 305, 307 of the inductor. Thus, a complete inductor is formed. The interconnecting material may be comprised of, for example, solder, metal-to-metal bonding, electrically-conductive, polymer, or various other bonding techniques known in the art.

With reference to FIG. 3B, a formed inductor 350 is shown independent of the first and second integrated circuit dice 301, 303 (FIG. 3A) to enhance clarity. The inductor first portion 305 is formed into the back side of the second integrated circuit die 303 (not shown) to mirror the inductor second portion 307 formed into the front side of the first integrated circuit die 301 (not shown). The interconnecting material 309 electrically connects the two inductor portions 305, 307 together. One of skill, in the art will recognize that the inductance value of the formed inductor 350 may be tuned depending upon a choice of adhesive 204 (FIGS. 2 and 3A) or other material selected for adhering the first and second integrated circuit dice 301, 303. Fabrication techniques for forming the inductor portions 305, 307 are described below.

Exemplary fabrication steps: for producing integrated circuit dice according to various embodiments of the present invention are presented graphically with reference to FIGS. 4A-4F. Using the techniques disclosed, integrated passive components may be readily produced using, for example, thin-film and plating techniques on the back side of a substrate (such as, for example, a silicon wafer). The substrate is then singulated into individual dice. An integrated circuit device is formed using traditional fabrication techniques on a front side of the substrate. Integrated passive components are then fabricated on the back side of the substrate. (In the case of an inductor fabricated on the front side of an integrated circuit die (e.g., the inductor first portion 307, FIGS. 3A and 3B), process steps are nearly identical and will be referenced as needed.)

In FIG. 4A, the substrate 401 has integrated circuit devices 403 fabricated upon the front side of the substrate 401. The integrated circuit devices 403 are optionally covered with a temporary coating 405. The temporary coating 405 protects the integrated circuit devices 403 for later processing steps which occur on the back side of the substrate 401. The temporary coating 405 may be, for example, an organic or metallic coating (e.g., photoresist or a deposited or sputtered metal layer). (A temporary coating may not be needed if fabricating an inductor first portion on the front side of a die. Alternatively, a nitride, or other dielectric film passivation layer may be added over the integrated circuit components prior to fabricating the inductor.)

In FIG. 4B, an optional dielectric material 407 is formed on the back side of the substrate 401. The optional dielectric material may be either an organic or inorganic material. In a specific exemplary embodiment, the optional dielectric material 407 is a high-k dielectric material (e.g., zirconium-doped tantalum oxide, zirconium oxide, tantalum pentoxide, etc.). A high-k dielectric layer increases the Q-factor of an inductor. (The nitride or other dielectric film passivation layer disclosed above may be used as the optional dielectric material 407 if fabricating an inductor first portion on the front side of a die.)

With reference to FIG. 4C, a metal seed layer 409 is applied to either the back side of the substrate 401 or to the optional dielectric material 407. The metal seed layer 409 forms a seed metal layer, for additional layers. The metal seed layer 409 may be, for example, an electrolytically plated metal layers such as a titanium-tungsten-copper (TiW—Cu) layer. Skilled artisans will recognize that other metals may be selected. The metal seed layer 409 is then coated with photoresist. Various passive components may be patterned and etched leaving an etched photoresist layer 411.

In FIG. 4D, a metal deposition 413 deposits metal into the open areas in the etched photoresist layer 411 thus forming a metal structure. The metal deposition 413 may be, for example, an electroplated layer comprised substantially of copper. Other techniques for forming one or more metal layers, for example, sputtering, may also be used. Additionally, other metals may be chosen so as to affect electrical characteristics of the passive component. For example, a metal having low conductivity may be used for forming resistive elements. Also, a combination of various metal types or metal alloys may be used in different geometric areas. A skilled artisan will recognize that certain types of metal may not require the metal seed layer 409. In these cases, a patterned photoresist 411 may be applied directly to the back side of the substrate 401 and metal applied (e.g., deposited, sputtered, etc.) without a need for either the optional dielectric material 407 or the metal seed layer 409. The choice of layers is dependent upon factors such as metal choice and metal-forming methods employed.

Figure 4E:
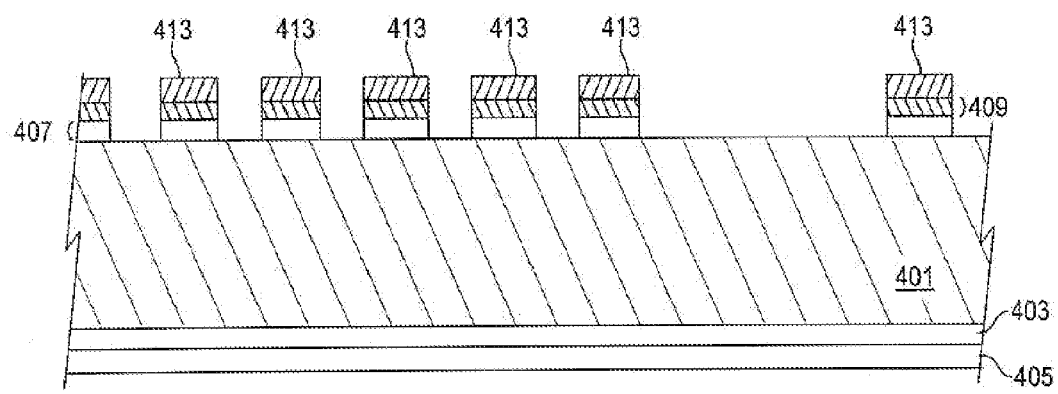
Figure 4F:
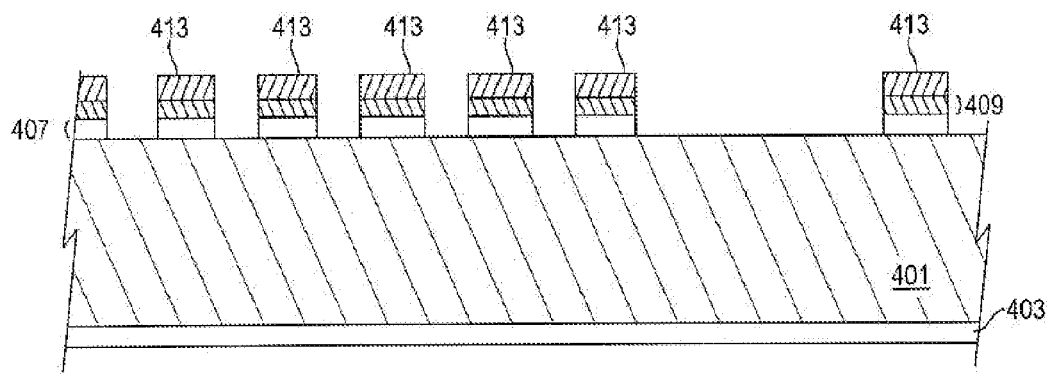

In FIG. 4E, the photoresist layer 411 may be stripped and exposed portions of the metal seed layer 409, if used, are etched. Alternatively, the photoresist layer 411 may simply be left in place. If present, exposed portions of the optional dielectric material 407 are also removed. The temporary coating 405 (FIGS. 4A-4E) is removed as illustrated In FIG. 4F.

All fabrication operations disclosed herein may be carried out at the substrate (e.g., wafer) level prior to singulation of individual dice formed before package assembly. Electrical connections can be achieved by joining appropriate areas with, for example, solder, conductive polymer, or metal-to-metal bonding processes. An optional polymer material, such as epoxy or acrylic, can be used to fill any gaps between the individual die and the substrate of the packaging device to assist in further anchoring the integrated circuit device to the package substrate. The integrated circuit device will then undergo a standard wire bonding process to connect bond pads on the individual die to the package substrate.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily used in various types of semiconductor packaging such as Quad Flat-Pack No-Lead (QFN), Dual Flat-Pack No-Lead (DFN), QTAPP® (thin array plastic package), ULGA® (ultra-thin, land grid array), BCC® (bumped chip carrier), or other package types. The specification and drawings are, accordingly, to be regarded in an illustrative rather than a restrictive sense.

What is claimed is:

1. An integrated circuit device comprising:
    a package substrate;
    a first substrate having a front side and a back side, the front side of the first substrate having one or more integrated circuit devices and a plurality of bond pads fabricated thereon, the first substrate being mounted to the package substrate;
    a second substrate having a front side, a back side, and a smaller area than the first substrate, the front side of the second substrate having one or more integrated circuit devices fabricated thereon, the second substrate being mounted to the first substrate;
    at least one passive component fabricated onto the back side of the second substrate, the at least one passive component being comprised of a metal structure;
    a first electrical conductor configured to allow electrical communications between the at least one passive component of the second substrate and at least one of the one or more integrated circuit devices of the first substrate;
    a second electrical conductor configured to allow electrical communications between the second substrate and the first substrate;
    a third electrical conductor configured to allow electrical communications between the first substrate and the package substrate, wherein the second electrical conductor and the third electrical conductor comprise a plurality of wire bonds;
    a first adhesive material to bond the back side of the first substrate to the package substrate;
    a second adhesive material to bond the back side of the second substrate to the front side of the first substrate; and
    an encapsulant formed over the package substrate, the first substrate, the second substrate and the plurality of wire bonds.

2. The integrated circuit device of claim 1, wherein the at least one passive component is an inductor.

3. The integrated circuit device of claim 1, wherein the metal structure is comprised substantially of copper.

4. The integrated circuit device of claim 1, further comprising:
    a dielectric material formed over the back side of the second substrate; and
    a metal seed layer formed between the dielectric material and the metal structure.

5. The integrated circuit device of claim 4, wherein the dielectric material is a high-k dielectric.

6. The integrated circuit device of claim 4, wherein the metal seed layer is comprised substantially of titanium-tungsten.

7. An integrated circuit device comprising:
    a package substrate;
    a first substrate having a front side and a back side, the front side of the first substrate having one or more integrated circuit devices and a plurality of bond pads fabricated thereon, the first substrate being mounted to the package substrate;
    a second substrate having a front side, a back side, and a smaller area than the first substrate, the front side of the second substrate having one or more integrated circuit devices fabricated thereon, the second substrate being mounted to the first substrate;

a first portion of at least one passive component fabricated onto the back side of the second substrate, the first portion of the at least one passive component being comprised of a first metal structure;

a second portion of the at least one passive component fabricated onto the front side of the first substrate, the second portion of the at least one passive component being comprised of a second metal structure formed to mirror the first portion of the at least one passive component;

a first electrical conductor configured to allow electrical communications between the first and second portions of the at least one passive component;

a second electrical conductor configured to allow electrical communications between the second substrate and the first substrate;

a third electrical conductor configured to allow electrical communications between the first substrate and the package substrate, wherein the second electrical conductor and the third electrical conductor comprise a plurality of wire bonds;

a first adhesive material to bond the back side of the first substrate to the package substrate;

a second adhesive material to bond the back side of the second substrate to the front side of the first substrate; and an encapsulant formed over the package substrate, the first substrate, the second substrate and the plurality of wire bonds.

8. The integrated circuit device of claim 7, wherein the at least one passive component is an inductor.

9. The integrated circuit device of claim 7, further comprising:

a dielectric material formed over the back side of the second substrate; and a metal seed layer formed between the dielectric material and the first metal structure.

10. An integrated circuit device comprising:

a package substrate;

a first substrate having a front side and a back side, the front side of the first substrate having one or more integrated circuit devices and a plurality of bond pads fabricated thereon, the first substrate being mounted to the package substrate;

a second substrate having a front side, a back side, and a smaller area than the first substrate, the front side of the second substrate having one or more integrated circuit devices fabricated thereon, wherein the first and second substrates are in a stacked relationship with the front side of the first substrate positioned adjacent the back side of the second substrate, the second substrate being mounted to the first substrate;

at least one passive component fabricated onto the back side of the second substrate and being electrically coupled to one or more integrated circuit devices on the front side of the first substrate;

a first electrical conductor configured to allow electrical communications between the second substrate and the first substrate;

a second electrical conductor configured to allow electrical communications between the first substrate and the package substrate, wherein the first electrical conductor and the second electrical conductor comprise a plurality of wire bonds;

a first adhesive material to bond the back side of the first substrate to the package substrate;

a second adhesive material to bond the back side of the second substrate to the front side of the first substrate; and an encapsulant formed over the package substrate, the first substrate, the second substrate and the plurality of wire bonds.

11. The integrated circuit device of claim 10, wherein the at least one passive component is an inductor.

12. The integrated circuit device of claim 10, further comprising:

a dielectric material formed over the back side of the second substrate; and a metal seed layer formed between the dielectric material and the at least one passive component that comprises a metal structure.

13. The integrated circuit device of claim 12, wherein the metal structure is comprised substantially of copper.

* * * * *

UNITED STATES PATENT AND TRADEMARK OFFICE
CERTIFICATE OF CORRECTION

PATENT NO.         : 7,932,590 B2
APPLICATION NO.    : 11/457409
DATED              : April 26, 2011
INVENTOR(S)        : Ken M. Lam It is certified that error appears in the above-identified patent and that said Letters Patent is hereby corrected as shown below:

IN THE SPECIFICATIONS:

Column 1, line 16, please delete "components," and insert therefor --components--;

Column 1, line 27, please delete "Enabling," and insert therefor --Enabling--;

Column 1, line 35, please delete "passive," and insert therefor --passive--;

Column 1, line 43, please delete "the," and insert therefor --the--;

Column 1, line 50, please delete "current," and insert therefor --current--;

Column 1, line 63, please delete "second," and insert therefor --second--;

Column 1, line 64, please delete "first," and insert therefor --first--;

Column 1, line 67, please delete "front," and insert therefor --front--;

Column 2, line 9, please delete "integrated," and insert therefor --integrated--;

Column 3, line 14, please delete "such," and insert therefor --such--;

Column 3, line 24, please delete "single," and insert therefor --single--;

Column 3, line 32, please delete "bail" and insert therefor --ball--;

Column 3, lines 40-41, please delete "accordance," and insert therefor --accordance--;

Column 3, line 41, please delete "embodiment," and insert therefor --embodiment--;

Signed and Sealed this
Twenty-eighth Day of August, 2012

David J. Kappos
*Director of the United States Patent and Trademark Office*

CERTIFICATE OF CORRECTION (continued)
U.S. Pat. No. 7,932,590 B2

Column 3, line 45, please delete "side," and insert therefor --side--;

Column 3, line 45, please delete "first," and insert therefor --first--;

Column 3, line 53, please delete "fabricated," and insert therefor --fabricated--;

Column 3, line 55, please delete "passive," and insert therefor --passive--;

Column 4, line 22, please delete "interconnecting," and insert therefor --interconnecting--;

Column 4, line 26, please delete "conductive," and insert therefor --conductive--;

Column 4, line 37, please delete "skill," and insert therefor --skill--;

Column 4, line 43, please delete "steps:" and insert therefor --steps--;

Column 5, line 1, please delete "nitride," and insert therefor --nitride--;

Column 5, line 18, please delete "layer," and insert therefor --layer--;

Column 5, line 48, please delete "In FIG. 4F." and insert therefor --in FIG. 4F.--;

Column 6, line 4, please delete "ultra-thin," and insert therefor --ultra-thin--.